(12) United States Patent
Xu et al.

(10) Patent No.: US 11,862,680 B2
(45) Date of Patent: Jan. 2, 2024

(54) ELECTROSTATIC DISCHARGE PROTECTION STRUCTURE, NITRIDE-BASED DEVICE HAVING THE SAME AND METHOD FOR MANUFACTURING NITRIDE-BASED DEVICE

(71) Applicant: XIAMEN SANAN INTEGRATED CIRCUIT CO., LTD., Xiamen (CN)

(72) Inventors: Ning Xu, Xiamen (CN); Wenbi Cai, Xiamen (CN); Cheng Liu, Xiamen (CN); Yuci Lin, Xiamen (CN); Nientze Yeh, Xiamen (CN)

(73) Assignee: HUNAN SAN'AN SEMICONDUCTOR CO., LTD., Hunan (CN)

( * ) Notice: Subject to any disclaimer, the term of this patent is extended or adjusted under 35 U.S.C. 154(b) by 323 days.

(21) Appl. No.: 17/344,159

(22) Filed: Jun. 10, 2021

(65) Prior Publication Data

US 2021/0391424 A1    Dec. 16, 2021

(30) Foreign Application Priority Data

Jun. 15, 2020    (CN) .......................... 202010543656.3

(51) Int. Cl.
*H01L 29/10*    (2006.01)
*H01L 29/06*    (2006.01)
(Continued)

(52) U.S. Cl.
CPC .......... *H01L 29/10* (2013.01); *H01L 29/0649* (2013.01); *H01L 29/404* (2013.01); *H01L 29/66462* (2013.01); *H01L 29/7786* (2013.01); *H01L 29/2003* (2013.01); *H01L 29/205* (2013.01)

(58) Field of Classification Search
CPC ... H01L 29/10; H01L 29/0649; H01L 29/404; H01L 29/66462; H01L 29/7786; H01L 29/2003; H01L 29/205; H01L 29/1066; H01L 29/41758; H01L 29/402; H01L 29/778; H01L 27/0248; H01L 27/0251
See application file for complete search history.

(56) References Cited

U.S. PATENT DOCUMENTS

| | | | | |
|---|---|---|---|---|
| 2011/0254012 A1* | 10/2011 | Vashchenko | ........ | H01L 27/0248 257/E21.407 |
| 2012/0068772 A1* | 3/2012 | Murad | ................ | H01L 29/7785 330/296 |

(Continued)

*Primary Examiner* — Dao H Nguyen
(74) *Attorney, Agent, or Firm* — Muncy, Geissler, Olds & Lowe, P.C.

(57) ABSTRACT

An electrostatic discharge protection structure for a nitride-based device having an active region, an electrostatic discharge protection region outside the active region for forming the electrostatic discharge protection structure, and a field plate formed in the active region is provided. The electrostatic discharge protection structure includes a channel layer, and a barrier layer, a first p-type nitride layer and a metal layer formed on the channel layer in such order. The metal layer is electrically connected to the field plate in the active region. A nitride-based device having the electrostatic discharge protection structure and a method for manufacturing a nitride-based device is also disclosed.

15 Claims, 12 Drawing Sheets

(51) Int. Cl.
  *H01L 29/40* (2006.01)
  *H01L 29/66* (2006.01)
  *H01L 29/778* (2006.01)
  *H01L 29/20* (2006.01)
  *H01L 29/205* (2006.01)

(56) References Cited

U.S. PATENT DOCUMENTS

| | | | | |
|---|---|---|---|---|
| 2012/0218783 | A1* | 8/2012 | Imada | H01L 29/0619 257/76 |
| 2013/0240894 | A1* | 9/2013 | Wurfl | H01L 27/027 257/E21.403 |
| 2014/0231874 | A1* | 8/2014 | Hoshi | H01L 29/7786 257/194 |
| 2014/0239346 | A1* | 8/2014 | Green | H01L 27/0629 257/192 |
| 2014/0353724 | A1* | 12/2014 | Fujita | H01L 29/6606 257/195 |
| 2015/0028390 | A1* | 1/2015 | Colino | H01L 29/7786 257/194 |
| 2022/0102344 | A1* | 3/2022 | Then | H01L 27/0688 |
| 2022/0416731 | A1* | 12/2022 | Parthasarathy | H03F 3/195 |
| 2023/0117946 | A1* | 4/2023 | Udrea | H01L 29/0619 257/183 |

* cited by examiner

ELECTROSTATIC DISCHARGE PROTECTION STRUCTURE, NITRIDE-BASED DEVICE HAVING THE SAME AND METHOD FOR MANUFACTURING NITRIDE-BASED DEVICE

CROSS-REFERENCE TO RELATED APPLICATION

This application claims priority of Chinese Invention Patent Application No. 202010543656.3, filed on Jun. 15, 2020.

FIELD

The disclosure relates to a semiconductor device, and more particularly to an electrostatic discharge protection structure, a nitride-based device having the same, and a method for manufacturing a nitride-based device.

BACKGROUND

Static electricity refers to static electric charges generated on a surface of an object where number of positive charges is not equal to that of negative charges. The static electric charges could be generated by transfer of electrons or ions when two surfaces are either in contact, rubbed and separated, during electrostatic induction, or during electrolysis. The object that carries the static electric charges is called a charged body. When an electrostatic field of a surface of the charged body exceeds a breakdown voltage of a medium layer around the charged body, the medium layer would break down and then part or all of the static electric charges are neutralized, i.e., a phenomenon known as electrostatic discharge (ESD). When ESD occurs, a pulse current is created, which rises rapidly and lasts for a very short time, and is accompanied by a short burst of an electromagnetic radiation. An electromagnetic energy of an electromagnetic pulse resulting from the electromagnetic radiation might cause functional failure of electronic products or electronic equipment, or damage to electronic components.

A conventional nitride-based device includes a field plate, which could effectively reduce a strength of an electric field near electrodes to raise a breakdown voltage of the conventional nitride-based device and reduce probability of electrons being excited into a surface state by a strong electric field so as to avoid current collapse of the conventional nitride-based device. Nevertheless, in the manufacturing process of the conventional nitride-based device, the field plate is in a floating state, i.e., a floating electrode, and the floating field plates are often damaged by ESD, or even the entire conventional nitride-based device are being damaged by ESD when static electric charges are easily generated. Moreover, conventional solutions to avoid ESD of devices is through installing components, such as a resistor divider, a diode, a MOS, or a parasitic bipolar transistor into the conventional nitride-based devices. However, the components installed could not lower risks of damage caused by ESD during manufacturing of the conventional nitride-based device, and the components would occupy an additional chip area at the same time.

SUMMARY

Therefore, an object of the disclosure is to provide an electrostatic discharge protection structure that can alleviate or eliminate at least one of the drawbacks of the prior art.

According to one aspect of the disclosure, an electrostatic discharge protection structure for a nitride-based device having an active region, an electrostatic discharge protection region outside the active region for forming the electrostatic discharge protection structure, and a field plate formed in the active region is provided. The electrostatic discharge protection structure includes a channel layer, and a barrier layer, a first p-type nitride layer and a metal layer formed on the channel layer in such order. The metal layer is electrically connected to the field plate in the active region.

According to another aspect of the disclosure, a nitride-based device includes an epitaxial structure, an isolation trench, a source electrode, a drain electrode, a gate electrode, a field plate, a first p-type nitride layer, and a metal layer. The epitaxial structure includes a substrate, and an epitaxial layer having a buffer layer, a channel layer, and a barrier layer that are disposed on the substrate in such order. The isolation trench is formed in the epitaxial structure, so as to divide the epitaxial structure into an active region and an electrostatic discharge protection region outside the active region. The source, drain, and gate electrodes are disposed on the active region of the epitaxial structure and spaced apart from each other. The field plate is disposed on the active region of the epitaxial structure and spaced apart from the source, drain, and gate electrodes. The first p-type nitride layer and the metal layer are formed on the barrier layer of the electrostatic discharge protection region of the epitaxial structure in such order.

According to yet another aspect of the disclosure, a method for manufacturing a nitride-based device is provided. The method includes the steps of: forming an epitaxial structure including a substrate and an epitaxial layer having a buffer layer, a channel layer, and a barrier layer disposed on the substrate in such order, the epitaxial structure having an electrostatic discharge protection region, a source region and a drain region; forming a first p-type nitride layer on the electrostatic discharge protection region of the epitaxial structure; forming a source electrode and a drain electrode on the source region and the drain region, respectively; forming an isolation trench in the epitaxial structure to isolate an active region including the source and drain regions from the electrostatic discharge protection region; disposing a dielectric layer to cover the active region, the source electrode, the drain electrode, and the electrostatic discharge protection region; removing the dielectric layer from the electrostatic discharge protection region to expose the first p-type nitride layer; depositing a first metallic material on the dielectric layer in the active region to form a field plate and on the first p-type nitride layer in the electrostatic discharge protection region to form a metal layer such that the metal layer is electrically connected to the field plate; forming an opening in the dielectric layer; and filling a second metallic material into the opening to form a gate electrode.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
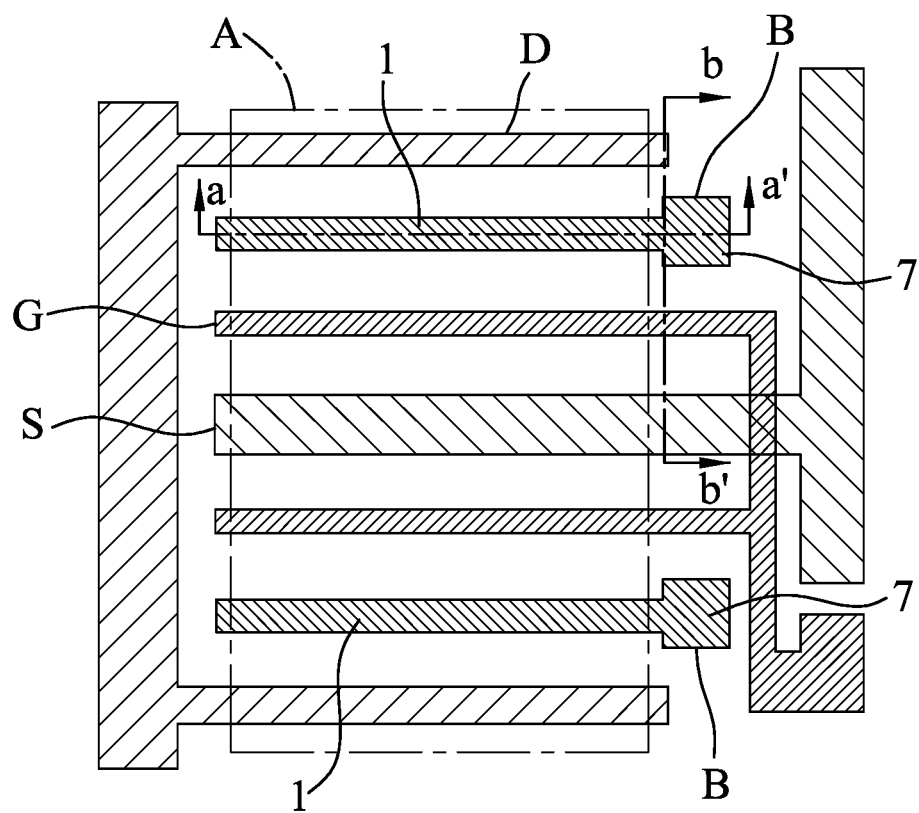
FIG. 1 is a top view illustrating a first embodiment of a nitride-based device of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

An electrostatic discharge (ESD) protection structure of this disclosure may be incorporated into various electronic devices for releasing static electricity that is generated during manufacturing thereof. In this disclosure, the ESD protection structure is applied to a nitride-based device, such as high electron mobility transistor (HEMT), but is not limited thereto.

Embodiment 1

Figure 2:
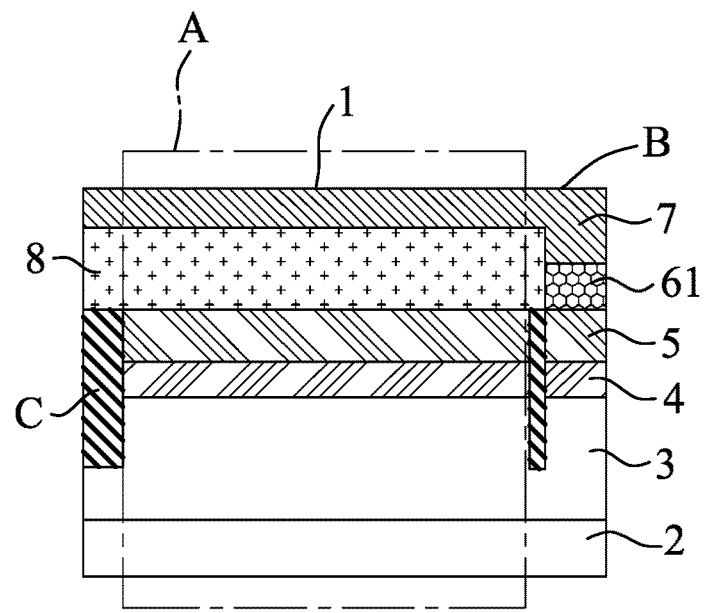
FIG. 2 is a cross-sectional view taken along line a-a' of FIG. 1.
Figure 3:
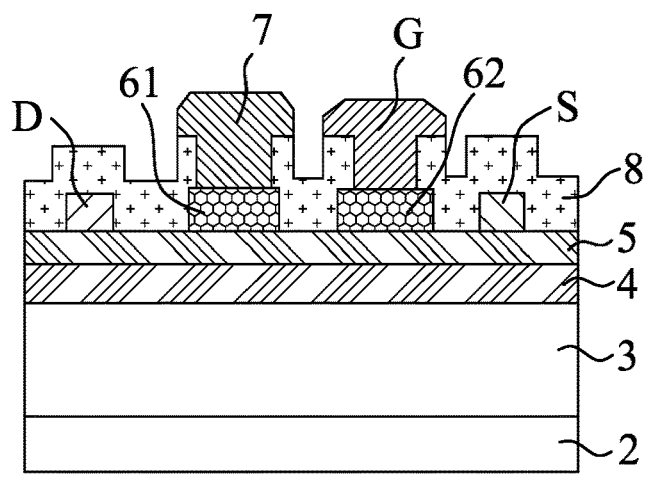
FIG. 3 is a cross-sectional view taken along line b-b' of FIG. 1.

Referring to FIGS. 1 to 3, a first embodiment of the nitride-based device having the ESD protection structure is illustrated. The nitride-based device includes an epitaxial structure, an isolation trench (C), a first p-type nitride layer 61, a source electrode (S), a drain electrode (D), a gate electrode (G), a field plate 1, and a metal layer 7. The epitaxial structure includes a substrate 2, and an epitaxial layer having a buffer layer 3, a channel layer 4, and a barrier layer 5 that are disposed on the substrate 2 in such order. The isolation trench (C) is formed in the epitaxial structure, so as to divide the epitaxial structure into an active region (A) and an ESD protection region (B) outside the active region (A). The source electrode (S), the drain electrode (D) and the gate electrode (G) are disposed on the active region (A) of the epitaxial structure and spaced apart from each other. The field plate 1 is disposed on the active region (A) of the epitaxial structure and spaced apart from the source electrode (S), the drain electrode (D) and the gate electrode (G).

The ESD protection structure includes the channel layer 4 of the ESD protection region (B), and the barrier layer 5 of the ESD protection region (B), the first p-type nitride layer 61 and the metal layer 7 formed on the channel layer 4 of the ESD protection region (B) of the epitaxial structure in such order. The metal layer 7 of the ESD protection structure is electrically connected to the field plate 1. A p-n junction is formed when the first p-type nitride layer 61 is in contact with the barrier layer 5.

In this embodiment, the nitride-based device further includes a dielectric layer 8 that is interposed between the field plate 1 and the active region (A) of the epitaxial structure exposed from the source electrode (S), the drain electrode (D) and the gate electrode (G).

Preferably, the nitride-based device further includes a second p-type nitride layer 62 that is interposed between the active region (A) of the epitaxial structure and the gate electrode (G). The dielectric layer 8 is interposed between the field plate 1 and the active region (A) of the epitaxial structure exposed from the source electrode (S), the drain electrode (D), the gate electrode (G) and the second p-type nitride layer 62.

The dielectric layer 8 has openings aligned with the first p-type nitride layer 61 and the second p-type nitride layer 62 for deposition of the metal layer 7 and the gate electrode (G), respectively.

In the nitride-based device, such as a HEMT, the substrate 2 may be made of one of silicon, silicon carbide, and gallium, nitride (GaN), but is not limited thereto. The buffer layer 3 may be made of GaN, but is not limited thereto. The channel layer 4 may be made of one of GaN, indium nitride (InN), and indium gallium nitride (InGaN), but is not limited thereto. The barrier layer 5 may be made of one of aluminum gallium nitride (AlGaN), aluminum nitride (AlN), indium aluminum nitride (InAlN), aluminum scandium nitride (AlScN), and indium aluminum gallium nitride (InAlGaN), but is not limited thereto.

In this embodiment, the substrate 2 is made of silicon, the buffer layer 3 is made of GaN, the channel layer 4 is made of GaN, and the barrier layer 5 is made of AlGaN. The first p-type nitride layer 61 and the second p-type nitride layer 62 are made from the same p-type nitride layer that is made of p-type group III nitride, such as p-type GaN, p-type AlGaN and p-type InAlGaN. Preferably, both the first and second p-type nitride layers 61, 62 have a p-type doping concentration ranging from $10^{17}$ cm$^{-3}$ to $10^{21}$ cm$^{-3}$.

In this embodiment, the metal layer 7 and the field plate 1 are made from the same metallic material layer that is made of a material selected from the group consisting of nickel, palladium, gold, titanium, aluminum, tungsten, and alloys and compounds thereof. In the case that the metal layer 7 is made of a material selected from the group consisting of nickel, palladium, gold, and alloys and compounds thereof, an ohmic contact is formed at an interface between the metal layer 7 and the first p-type nitride layer 61. In the case that the metal layer 7 is made of a material selected from the group consisting of titanium, aluminum, tungsten, and alloys and compounds thereof, a Schottky contact is formed at the interface between the metal layer 7 and the first p-type nitride layer 61.

In the conventional nitride-based device, lots of electric charges are accumulated on field plates and could not be released. That is because each of the field plates is disposed on a dielectric layer that is insulated, i.e., in a floating state, so that the electric charges could not be released through the dielectric layer, and thus might lead to ESD. In contrast, in the nitride-based device having the ESD protection structure of this disclosure, two-dimensional electron gas (2DEG) is generated at the channel layer 4 when a heterojunction is formed at an interface of the channel layer 4 (i.e., the GaN layer) and the barrier layer 5 (i.e., the AlGaN layer), where self-polarization or piezoelectric polarization occurs. Further, the p-n junction is formed at an interface of the barrier layer 5 and the first p-type nitride layer 61. When electric charges generated during manufacturing of the nitride-based device accumulates on the field plate 1 to an extent that the field plate 1 has a voltage relative to ground (i.e., the substrate 2) higher than 3.4 V, the p-n junction is forward-biased and allows the electric charges to flow from the first p-type nitride layer 61 to the substrate 2. As a result, charge release and effective reduction of risks of damage by ESD during manufacturing of the nitride-based device can be achieved.

FIG. 1 is a top view illustrating a positional relationship of the source electrode (S), the drain electrode (S), the gate electrode (G) and the field plate 1. The dielectric layer 8 and other interconnect structures, etc., are omitted. It is noted that the source electrode (S), the drain electrode (D), the gate electrode (G) and the field plate 1 may be located at different altitude and are disjoint spatially, as is known to those skilled in the art of semiconductor fabrication. In this embodiment, the field plate 1 is classified as a source-field plate, which is positioned between the drain electrode (D) and the gate electrode (G) so as to effectively reduce a strength of an electric field near the drain electrode (D).

In this embodiment, the nitride-based device includes a plurality of the field plates 1 spaced apart from each other. The metal layer 7 and the first p-type nitride layer 61 of the electrostatic discharge protection structure are respectively formed into spaced-apart islands. Each of the islands of the metal layer 7 is disposed on a corresponding one of the islands of the first p-type nitride layer 61. Each of the field plates 1 is electrically connected to a corresponding one of the islands of the metal layer 7.

Referring to FIGS. 4A to 4G and FIGS. 5A to 5G, a method for manufacturing the first embodiment of the nitride-based device is illustrated based on two cross-sectional views taken along line a-a' of FIG. 1 and line b-b' in FIG. 1 that is perpendicular to line a-a'.

The method includes consecutive steps from steps S1 to S9.

Figure 4A:
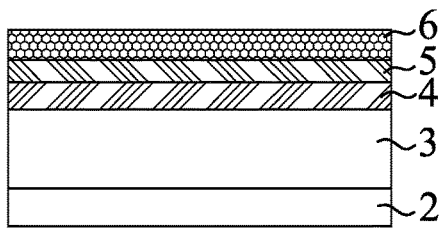
FIGS. 4A to 4G are schematic views taken along line a-a' of FIG. 1, illustrating consecutive steps of a method for manufacturing the first embodiment of the nitride-based device.
Figure 5A:
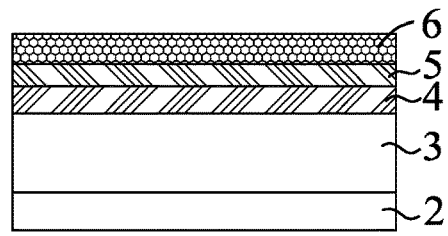
FIGS. 5A to 5G are schematic views taken along line b-b' of FIG. 1, illustrating the consecutive steps of the method for manufacturing the first embodiment of the nitride-based device.

In step S1, the epitaxial structure including the substrate 2 and the epitaxial layer having the buffer layer 3, the channel layer 4, the barrier layer 5, and a p-type nitride unit 6 that are disposed on the substrate 2 in such order is provided, as shown in FIGS. 4A and 5A. The epitaxial layer is made of nitride-based materials suitable for forming a HEMT. In this embodiment, the buffer layer 3 is made of GaN and the channel layer 4 is made of GaN. The barrier layer 5 has a chemical formula of $Al_{x1}Ga_{(1-x1)}N$, where x1 may range from 0.01 to 1, and a thickness that may range from 1 nm to 50 nm. The p-type nitride unit 6 may has a thickness ranging from 50 nm to 300 nm, and a p-type doping concentration ranging from $10^{17}$ cm$^{-3}$ to $10^{21}$ cm$^{-3}$. Moreover, the epitaxial structure has the ESD protection region (B), a source region, a drain region, and a gate region.

Figure 4B:
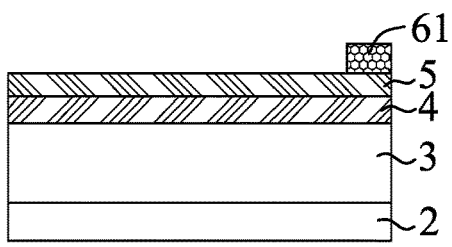
Figure 5B:
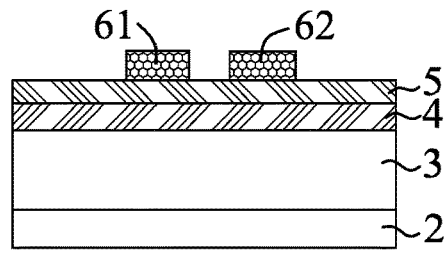

In step S2, the p-type nitride unit 6 is etched during a photolithography process to form the first p-type nitride layer 61 on the electrostatic discharge protection region (B) of the epitaxial structure and the second p-type nitride layer 62 on the gate region (G) of the epitaxial structure, as shown in FIGS. 4B and 5B. The first p-type nitride layer 61 is formed into spaced-apart islands. Examples of the etching technique include inductively coupled plasma (ICP) etching and reactive-ion etching (RIE).

Figure 4C:
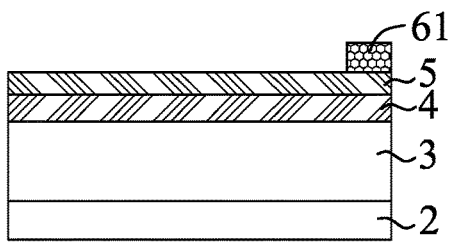
Figure 5C:
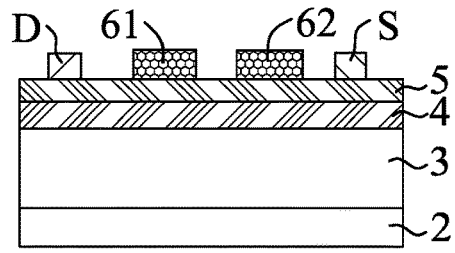

In step S3, the source electrode (S) and the drain electrode (D) are formed on the source region and the drain region, respectively, as shown in FIGS. 4C and 5C. To be specific, the source electrode (S) and the drain electrode (D) are formed by depositing a material, which may be selected from the group consisting of titanium, aluminum, nickel, gold, tantalum, and alloys and compounds thereof, on the source region and the drain region using one of evaporative physical vapor deposition (PVD) and sputtering PVD. Then, the deposited material is patterned using photolithography process to form the source electrode (S) and the drain electrode (D).

Figure 4D:
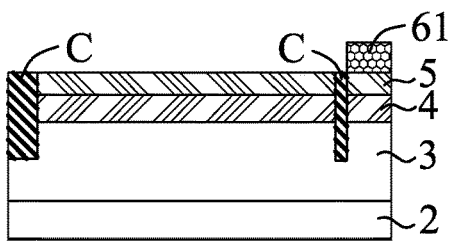
Figure 5D:
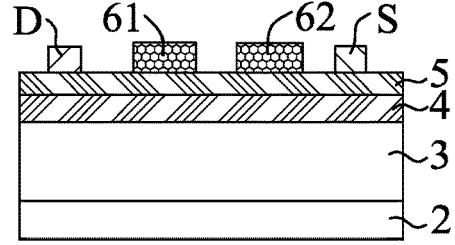

In step S4, the isolation trench (C) is formed in the epitaxial structure to isolate the active region (A) including the source, drain, and gate regions from the ESD protection region (B), as shown in FIGS. 4D and 5D. The isolation trench (C) may be formed by ion implantation to be a region with high resistance. The isolation trench (C) may also be formed by photolithography and then filling an insulation material therein.

Figure 4E:
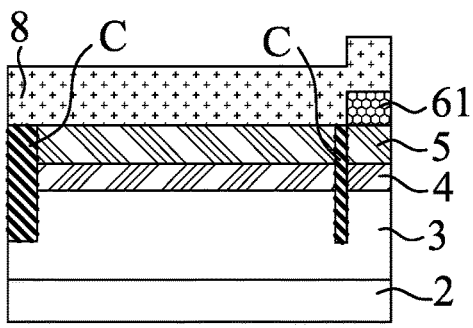
Figure 5E:
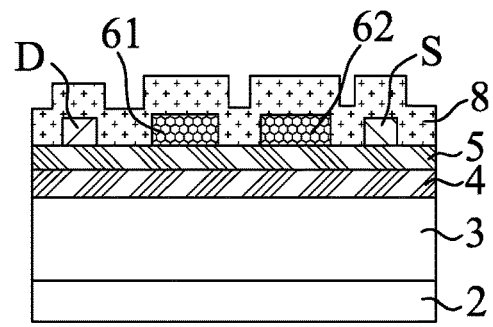

In step S5, the dielectric layer 8 is disposed to cover the active region (A), the source electrode (S), the drain electrode (D), and the ESD protection region (B), as shown in FIGS. 4E and 5E.

In step S6, the dielectric layer 8 in the ESD protection region (B) is partially removed to form an opening so as to expose the first p-type nitride layer 61.

Figure 4F:
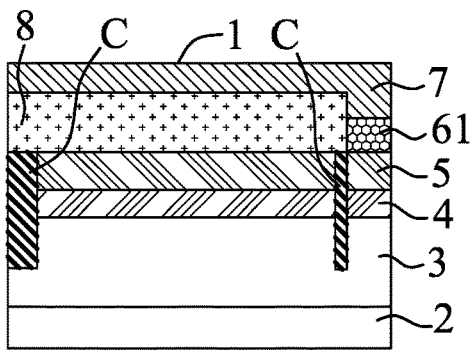
Figure 5F:
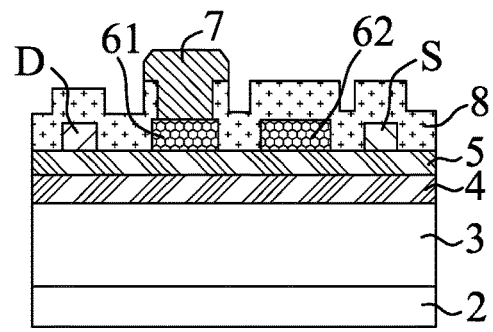

In step S7, a first metallic material is deposited on the dielectric layer 8 in the active region (A) to form the field plates 1 spaced apart from each other using photolithography, and is also deposited on the first p-type nitride layer 61 in the ESD protection region (B) to form the metal layer 7. The metal layer 7 thus formed is in contact with the first p-type nitride layer 61 through the opening of the dielectric layer 8. The metal layer 7 is formed into the spaced-apart islands using photolithography, and each of the islands of the metal layer 7 is electrically connected to a corresponding one of the field plates 1. Deposition of the first metallic material is performed using one of evaporative PVD and sputtering PVD, as shown in FIGS. 4F and 5F. The first metallic material may be selected from the group consisting of nickel, palladium, gold, titanium, aluminum, tungsten, and alloys and compounds thereof.

In step S8, the dielectric layer 8 is formed with an opening that is aligned with the second p-type nitride layer 62 in the gate region.

Figure 4G:
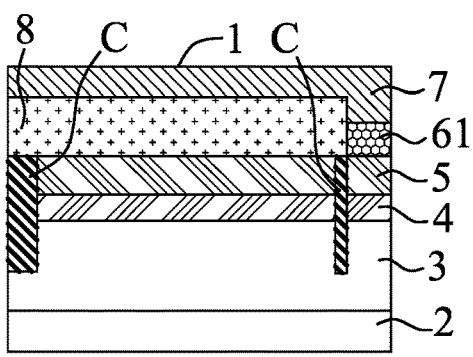
Figure 5G:
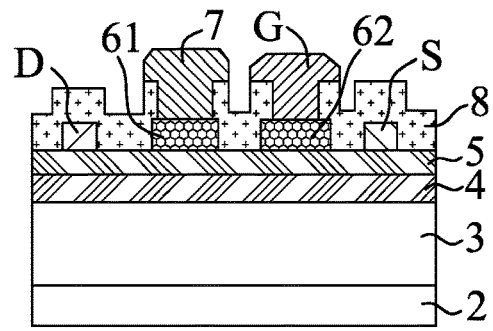

In step S9, a second metallic material is filled into the opening in the gate region to form the gate electrode (G) on the second p-type nitride layer 62 using one of evaporative PVD and sputtering PVD, as shown in FIGS. 4G and 5G. Examples of the second metallic material may include nickel, palladium, gold, titanium, aluminum, tungsten, and alloys and compounds thereof. The gate electrode (G) is in contact with the second p-type nitride layer 62 through the opening in the gate region.

Next, conventional processes for manufacturing the nitride-based device are subsequently performed, such as formation of metal interconnect layers in a back-end-of-the-line section and formation of electrical connections between the metal interconnect layers and the source, drain, and gate electrodes (S, D, G) in a middle-of-the-line section for manufacturing the nitride-based device. Since such processes are not the essential features of the disclosure, detailed description thereof is omitted herein.

Figure 6:
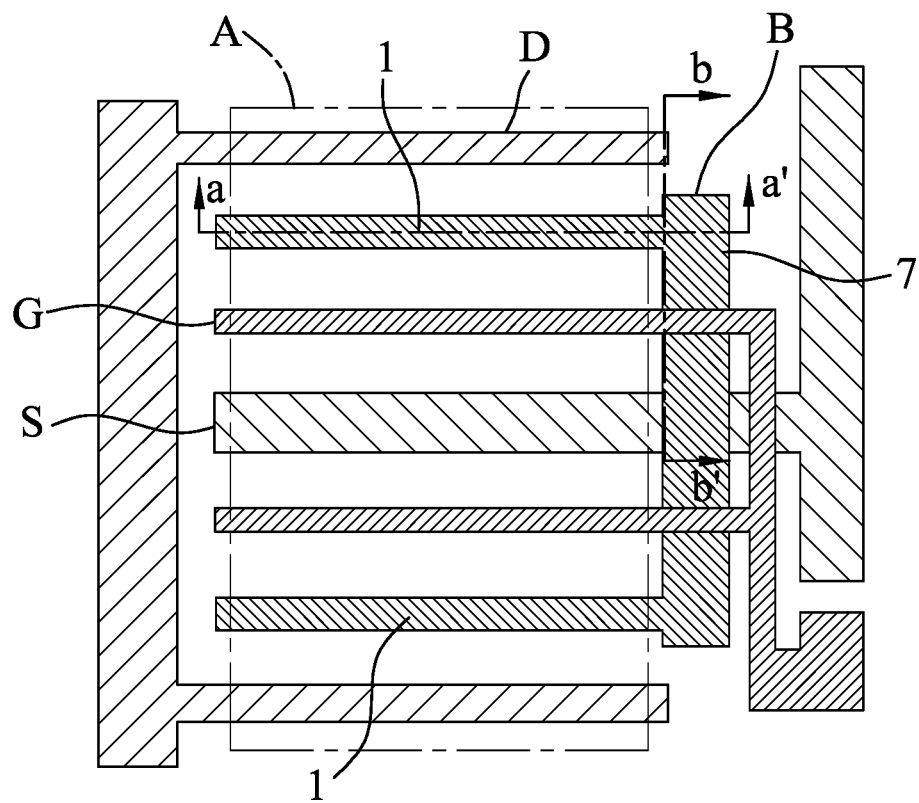
FIG. 6 is a top view illustrating a variant of the first embodiment of the nitride-based device.
Figure 7:
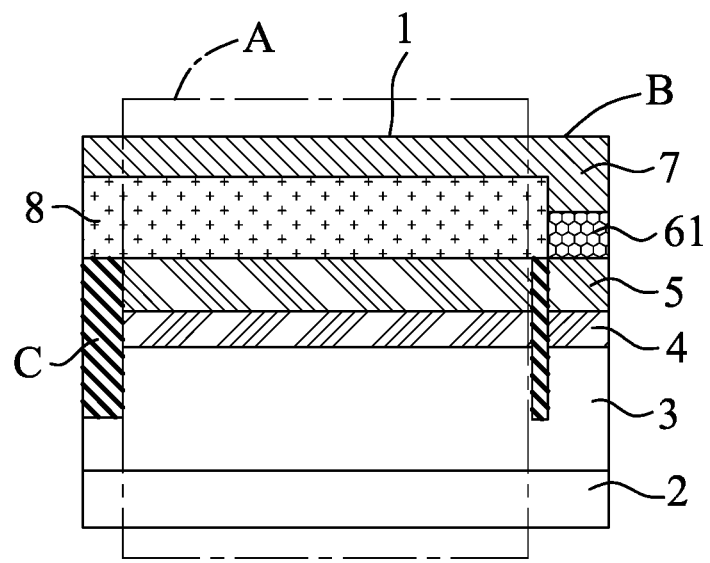
FIG. 7 is a cross-sectional view taken along line a-a' of FIG. 6.
Figure 8:
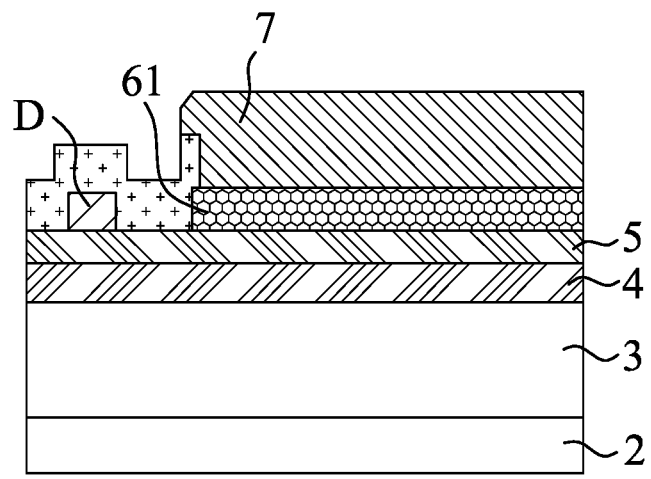
FIG. 8 is a cross-sectional view taken along line b-b' of FIG. 6.

Referring to FIGS. 6 to 8, in a variant of this embodiment, the metal layer 7 of the electrostatic discharge protection structure is likewise disposed on the first p-type nitride layer 61. The first p-type nitride layer 61 and the metal layer 7 are plate-shaped. The field plates 1 are electrically connected to the metal layer 7 of the electrostatic discharge protection structure.

That is to say, the metal layer 7 has a length larger than a pitch of the field plates 1, so that the field plates 1 are able to be electrically connected to the same metal layer 7 of the electrostatic discharge protection structure, as shown in FIGS. 6 to 8.

The method for manufacturing the variant of the nitride-based device is similar to the abovementioned method for manufacturing the first embodiment, except that each of the first p-type nitride layer 61 and the metal layer 7 is formed into a plate, and the plate of the metal layer 7 is electrically connected to the field plates 1.

Embodiment 2

Figure 9:
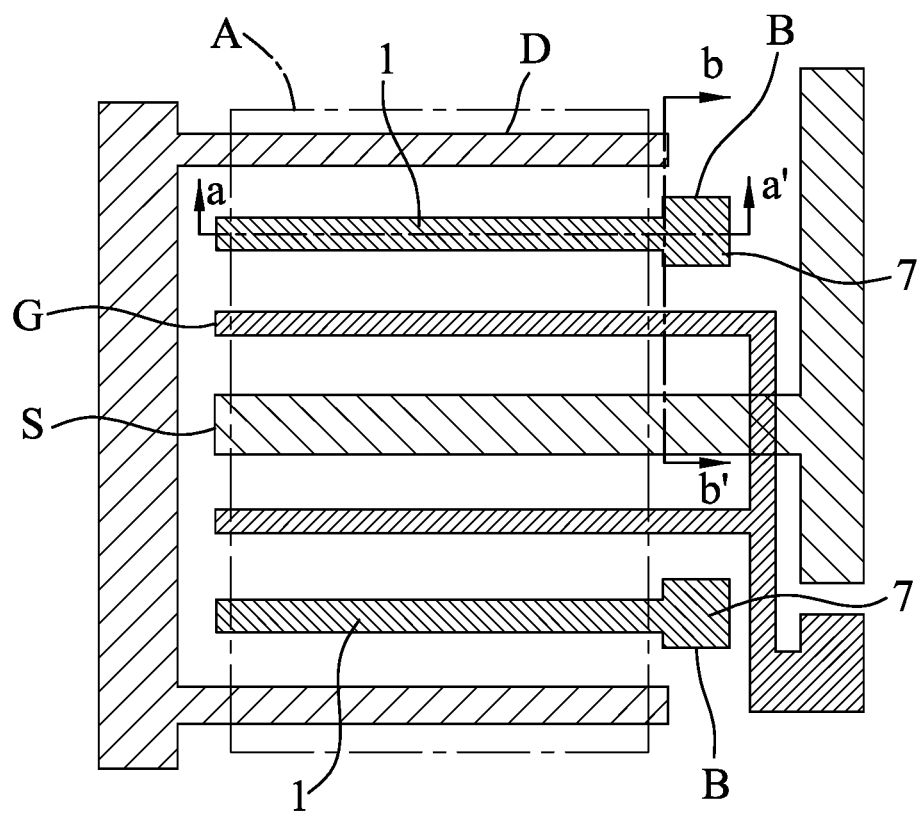
FIG. 9 is a top view illustrating a second embodiment of the nitride-based device of the disclosure.
Figure 10:
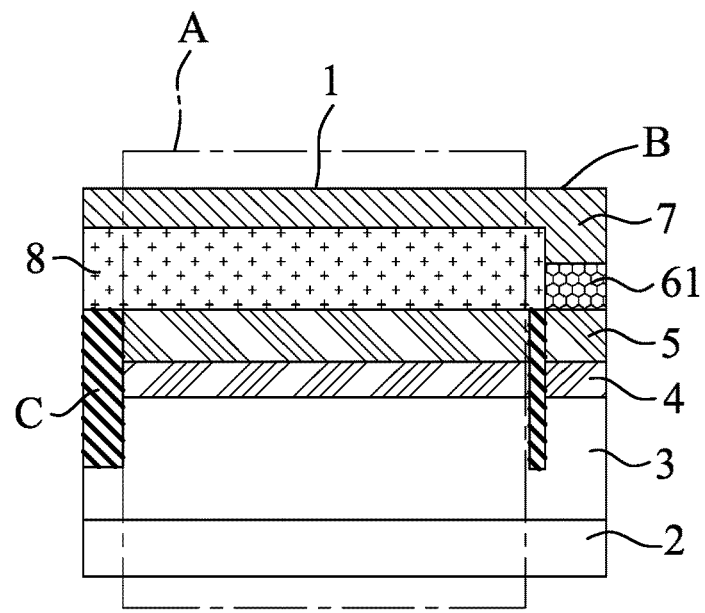
FIG. 10 is a cross-sectional view taken along line a-a' of FIG. 9.
Figure 11:
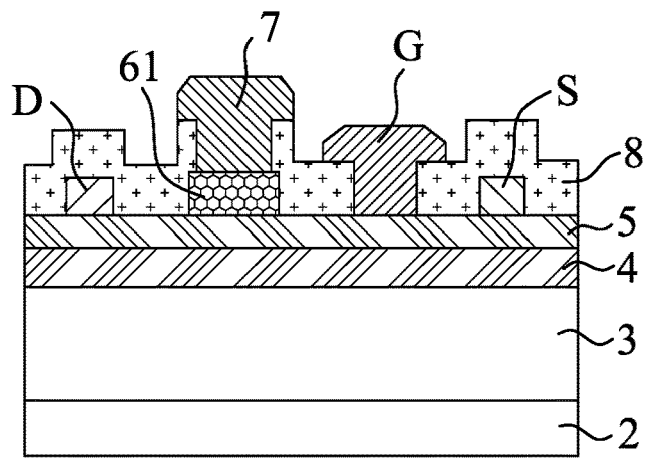
FIG. 11 is a cross-sectional view taken along line b-b' of FIG. 9.

Referring to FIGS. 9 to 11, a second embodiment of the nitride-based device has a structure similar to that of the first embodiment. However, the second p-type nitride layer 62 is omitted so that the gate electrode (G) is in contact with the barrier layer 5.

In this embodiment, the nitride-based device includes the dielectric layer 8 interposed between the field plate 1 and the active region (A) of the epitaxial structure exposed from the source electrode (S), the drain electrode (D), and the gate electrode (G).

Referring to FIGS. 12A to 12G and FIGS. 13A to 13G, a method for manufacturing the second embodiment of the nitride-based device is illustrated based on two cross-sectional schematic views taken along line a-a' of FIG. 9 and line b-b' of FIG. 9 that is perpendicular to line a-a'.

The method for manufacturing the second embodiment of the nitride-based device having the ESD protection structure includes consecutive steps S1 to S9.

Figure 12A:
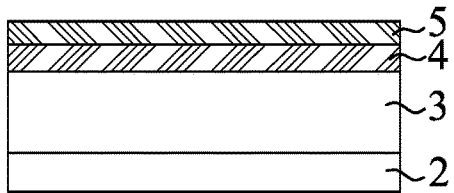
FIGS. 12A to 12G are schematic views taken along line a-a' of FIG. 9, illustrating consecutive steps of a method for manufacturing the second embodiment of the nitride-based device.
Figure 13A:
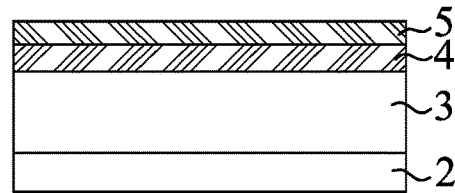
FIGS. 13A to 13G are schematic views taken along line b-b' of FIG. 9, illustrating the consecutive steps of the method for manufacturing the second embodiment of the nitride-based device.

In step S1, the epitaxial structure including the substrate 2, and the epitaxial layer that has the buffer layer 3, the channel layer 4, and the barrier layer 5 disposed on the substrate 2 in such order is provided, as shown in FIGS. 12A and 13A. The epitaxial layer is made of nitride-based materials suitable for forming the HEMT. In this embodiment, the buffer layer 3 is made of GaN, the channel layer 4 is made of GaN, and the barrier layer 5 is made of AlGaN. The epitaxial structure has the ESD protection region (B), the source region and the drain region.

Figure 12B:
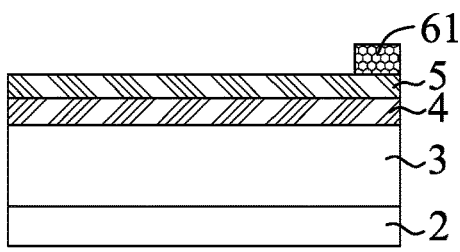
Figure 13B:
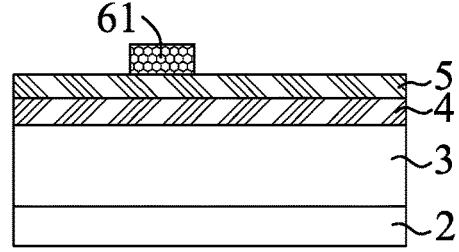

In step S2, the first p-type nitride layer 61 is formed on the ESD protection region (B) of the epitaxial structure through selective-area secondary epitaxial growth, as shown in FIGS. 12B and 13B. To be specific, a mask layer that is made of a material such as silicon nitride or silicon dioxide is formed on the epitaxial layer. The epitaxial structure of the ESD protection region (B) is then exposed from the mask layer by photolithography based on a predetermined shape of the first p-type nitride layer 61. Subsequently, the first p-type nitride layer 61 is formed on the barrier layer 5 (i.e., AlGaN layer) of the ESD protection region (B) through selective-area secondary epitaxial growth, and is formed into spaced-apart islands. Finally, the mask layer is removed by one of wet etching and dry etching, such as ICP etching or RIE. The first p-type nitride layer 61 has a thickness ranging from 50 nm to 300 nm, and a p-type doping concentration ranging from $10^{17}$ cm$^{-3}$ to $10^{21}$ cm$^{-3}$. An example of p-type dopant in the first p-type nitride layer 61 includes magnesium (Mg).

Figure 12C:
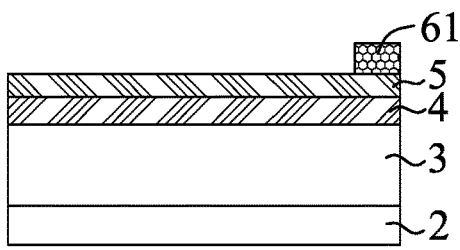
Figure 13C:
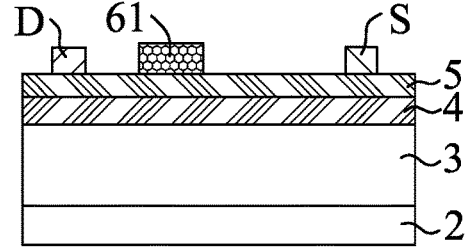

In step S3, the source electrode (S) and the drain electrode (D) are formed on the source region and the drain region, respectively, as shown in FIGS. 12C and 13C. Details regarding the formation of the source electrode (S) and the drain electrode (D) are similar to those described above with reference to FIGS. 4C and 5C.

Figure 12D:
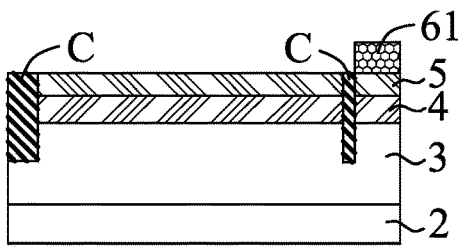
Figure 13D:
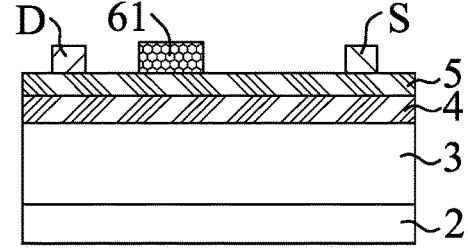

In step S4, the isolation trench (C) is formed in the epitaxial structure to isolate the active region (A) including the source and drain regions from the ESD protection region (B), as shown in FIGS. 12D and 13D. Details regarding the formation of the isolation trench (C) are similar to those described above with reference to FIGS. 4D and 5D.

Figure 12E:
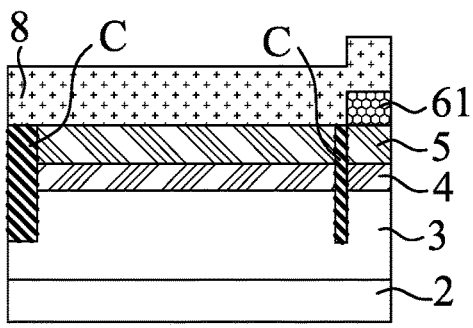
Figure 13E:
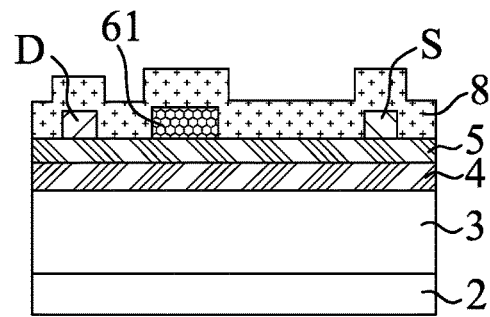

In step S5, the dielectric layer 8 is disposed to cover the active region (A), the source electrode (S), the drain electrode (D), and the ESD protection region (B), as shown in FIGS. 12E and 13E.

In step S6, the dielectric layer 8 is removed from the ESD protection region (B) to expose the first p-type nitride layer 61.

Figure 12F:
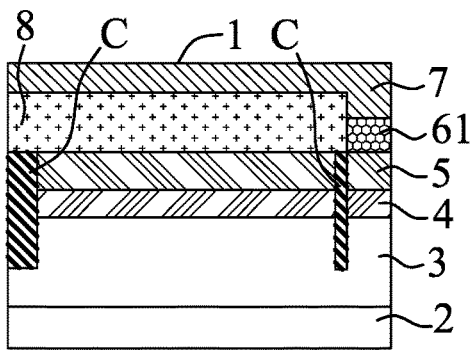
Figure 13F:
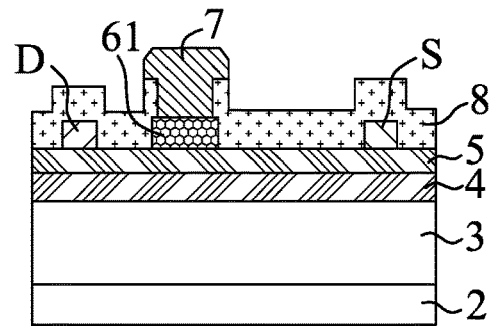

In step S7, the first metallic material is deposited on the dielectric layer 8 in the active region (A) to form the field plates 1 spaced apart from each other, and on the first p-type nitride layer 61 in the ESD protection region (B) to form the metal layer 7 into the spaced-apart islands, such that the spaced-apart islands of the metal layer 7 can be respectively and electrically connected to the field plates 1, as shown in FIGS. 12F and 13F. Details regarding the formation of the field plate 1 and the metal layer 7 are similar to those described above with reference to FIGS. 4F and 5F.

In step S8, the dielectric layer 8 is formed with an opening in the gate region.

Figure 12G:
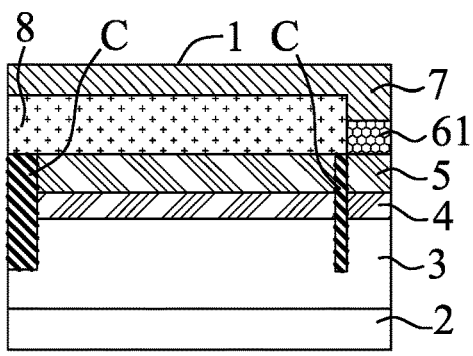
Figure 13G:
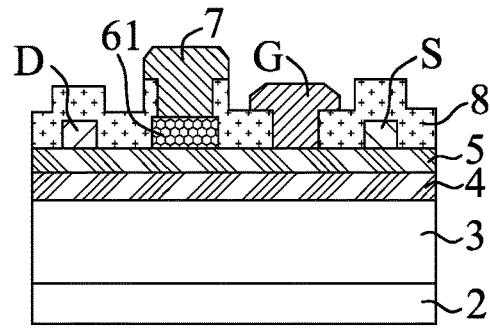

In step S9, the second metallic material is filled into the opening in the gate region to form the gate electrode (G), as shown in FIGS. 12G and 12G. The gate electrode (G) is in contact with the barrier layer 5 (i.e., the AlGaN layer) through the opening. Details regarding the formation of the gate electrode (G) are similar to those described above with reference to FIGS. 4G and 5G.

Next, conventional processes for manufacturing the nitride-based device are performed, such as formation of metal interconnect layers in a back-end-of-the-line section and formation of electrical connections between the metal interconnect layers and the source, drain, and gate electrodes (S, D, G) in a middle-of-the-line section. Such processes are not the essential features of the disclosure, and thus, detailed description thereof is omitted herein.

Embodiment 3

Figure 14:
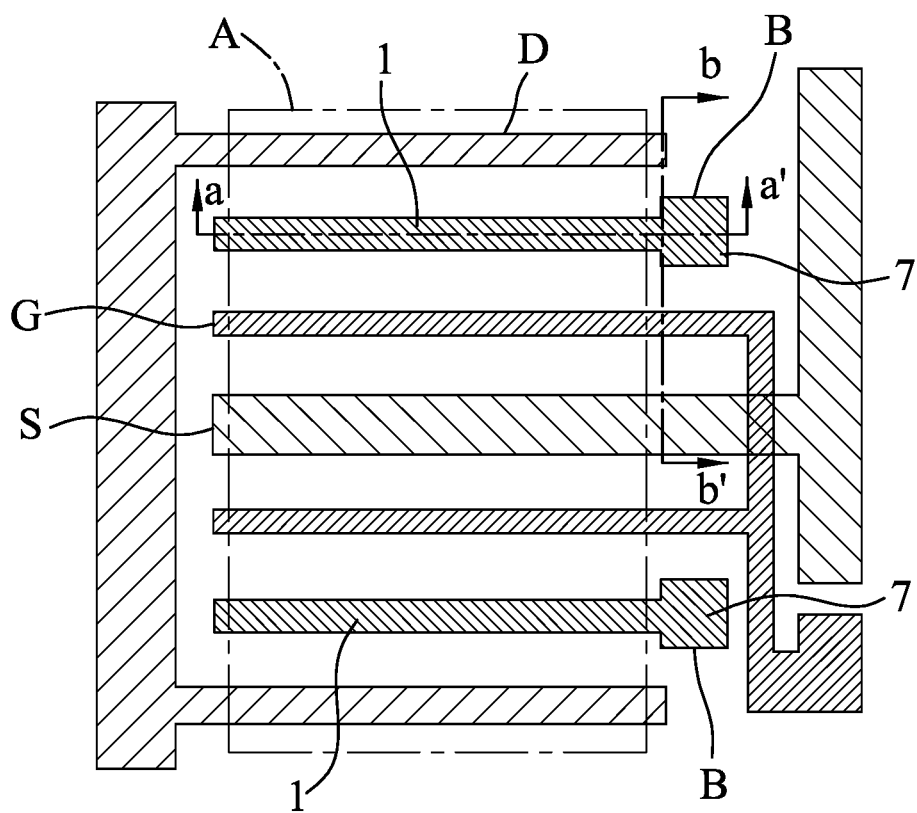
FIG. 14 is a top view illustrating a third embodiment of the nitride-based device of the disclosure.
Figure 15:
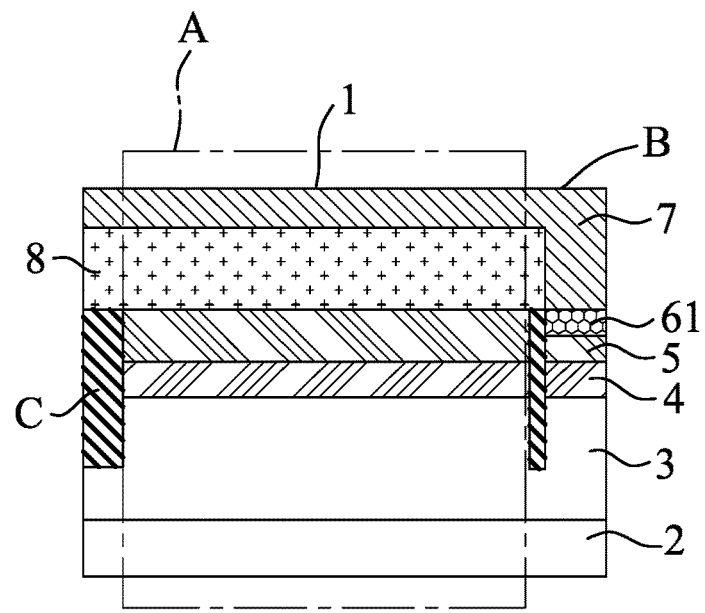
FIG. 15 is a cross-sectional view taken along line a-a' of FIG. 14.
Figure 16:
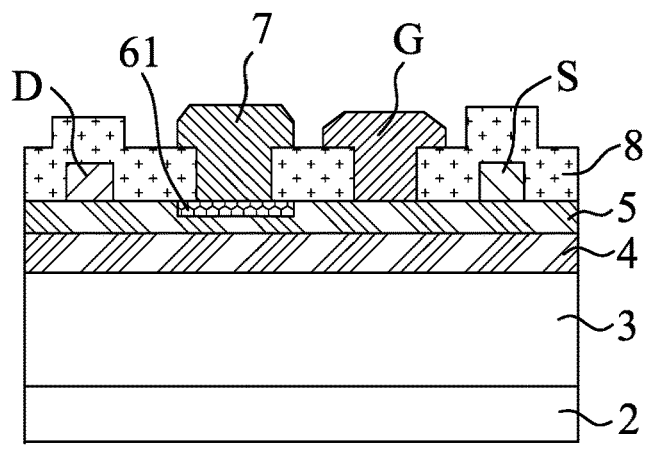
FIG. 16 is a cross-sectional view taken along line b-b' of FIG. 14.

Referring to FIGS. 14 to 16, a third embodiment of the nitride-based device has a structure similar to that of the second embodiment of the nitride-based device having the ESD protection structure. However, the first p-type nitride layer 61 is formed in an upper region of the barrier layer 5 of the ESD protection region (B) of the epitaxial structure, and is exposed from an upper surface of the barrier layer 5 to be in contact with the metal layer 7 disposed thereon.

A method for manufacturing the third embodiment of the nitride-based device is similar to that of the second embodiment, except that the first p-type nitride layer 61 is formed through ion implantation, or ion diffusion in step S2, rather than through selective-area secondary epitaxial growth. To be specific, a mask layer that is made of a material such as silicon nitride or silicon dioxide is formed on the epitaxial layer. The epitaxial structure of the ESD protection region (B) is then exposed from the mask layer by photolithography based on a predetermined shape of the first p-type nitride layer 61. Subsequently, the first p-type nitride layer 61 is formed in the upper region of the barrier layer 5 of the ESD protection region (B) through ion implantation or ion diffusion, and then dopants for ion implantation or ion diffusion, such as Mg, are activated at high temperature. Finally, the mask layer is removed by one of wet etching and dry etching, such as ICP etching or RIE. The p-type doping concentration of the first p-type nitride layer 61 ranges from $10^{17}$ cm$^{-3}$ to $10^{21}$ cm$^{-3}$.

In summary, the electrostatic discharge protection structure of this disclosure achieves the purpose of charge release and effectively reduces risks of damage by ESD during manufacturing of the nitride-based device. Furthermore, the electrostatic discharge protection structure of this disclosure is applicable to the nitride-based device with different configurations of the gate electrode (G) by taking advantage of a region of the epitaxial structure that is positioned outside the active region (A) of the same without occupying additional chip area. In addition, the method for manufacturing the electrostatic discharge protection structure of this disclosure can be included in the method for manufacturing the nitride-based device. Hence, the method of manufacturing the nitride-based device having the electrostatic discharge protection structure is simple, low cost, and is suitable for actual mass production.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electrostatic discharge protection structure for a nitride-based device, the nitride-based device having an active region, an electrostatic discharge protection region outside the active region for forming said electrostatic discharge protection structure, and a field plate formed in the active region, said electrostatic discharge protection structure comprising:
    a channel layer; and
    a barrier layer, a first p-type nitride layer, and a metal layer formed on said channel layer in such order,
    wherein said metal layer is electrically connected to the field plate.

2. The electrostatic discharge protection structure of claim 1, wherein said first p-type nitride layer is made of p-type group III nitride.

3. The electrostatic discharge protection structure of claim 2, wherein said first p-type nitride layer is made of one of p-type gallium nitride, p-type aluminum gallium nitride and p-type indium aluminum gallium nitride.

4. The electrostatic discharge protection structure of claim 1, wherein said first p-type nitride layer has a p-type doping concentration ranging from $10^{17}$ cm$^{-3}$ to $10^{21}$ cm$^{-3}$.

5. The electrostatic discharge protection structure of claim 1, wherein said metal layer is disposed on said first p-type nitride layer, said first p-type nitride layer and said metal layer being plate-shaped, the nitride-based device including a plurality of the field plates spaced apart from each other and electrically connected to said metal layer.

6. The electrostatic discharge protection structure of claim 1, wherein said metal layer and said first p-type nitride layer are respectively formed into spaced-apart islands, each of said islands of said metal layer being disposed on a corresponding one of said islands of said first p-type nitride layer, the nitride-based device including a plurality of the field plates spaced apart from each other, each of the field plates being electrically connected to a corresponding one of said islands of said metal layer.

7. The electrostatic discharge protection structure of claim 1, wherein said metal layer is made of a material selected from the group consisting of nickel, palladium, gold, titanium, aluminum, tungsten, and alloys and compounds thereof.

8. A nitride-based device, comprising:
    an epitaxial structure including a substrate and an epitaxial layer disposed on said substrate, said epitaxial layer having a buffer layer, a channel layer, and a barrier layer disposed on said substrate in such order;
    an isolation trench formed in said epitaxial structure, so as to divide said epitaxial structure into an active region and an electrostatic discharge protection region outside said active region;
    a source electrode, a drain electrode and a gate electrode being disposed on said active region of said epitaxial structure and spaced apart from each other;
    a field plate that is disposed on said active region of said epitaxial structure and spaced apart from said source electrode, said drain electrode and said gate electrode; and
    a first p-type nitride layer and a metal layer formed on said barrier layer of said electrostatic discharge protection region of said epitaxial structure in such order.

9. The nitride-based device of claim 8, wherein said nitride-based device includes a plurality of said field plates spaced apart from each other, said metal layer being disposed on said first p-type nitride layer, said first p-type nitride layer and said metal layer being plate-shaped, said field plates being electrically connected to said metal layer.

10. The nitride-based device of claim 8, wherein said nitride-based device includes a plurality of said field plates spaced apart from each other, said metal layer and said first p-type nitride layer are respectively formed into spaced-apart islands, each of said islands of said metal layer being disposed on a corresponding one of said islands of said first p-type nitride layer, each of said field plates being electrically connected to a corresponding one of said islands of said metal layer.

11. The nitride-based device of claim 8, further comprising a dielectric layer interposed between said field plate and said active region of said epitaxial structure exposed from said source electrode, said drain electrode and said gate electrode.

12. The nitride-based device of claim 8, further comprising a second p-type nitride layer interposed between said active region of said epitaxial structure and said gate electrode.

13. The nitride-based device of claim 12, wherein said second p-type nitride layer and said first p-type nitride layer are made from a same p-type nitride layer.

14. The nitride-based device of claim 12, wherein said first and second p-type nitride layers have a p-type doping concentration ranging from $10^{17}$ cm$^{-3}$ to $10^{21}$ cm$^{-3}$.

15. The nitride-based device of claim 12, further comprising a dielectric layer interposed between said field plate and said active region of said epitaxial structure exposed from said source electrode, said drain electrode, said gate electrode and said second p-type nitride layer.

\* \* \* \* \*